: US006249562B1

United States Patent
Wells

(10) Patent No.: US 6,249,562 B1
(45) Date of Patent: Jun. 19, 2001

(54) METHOD AND SYSTEM FOR IMPLEMENTING A DIGIT COUNTER OPTIMIZED FOR FLASH MEMORY

(75) Inventor: Steven E. Wells, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/379,175

(22) Filed: Aug. 23, 1999

(51) Int. Cl.$^7$ ...................................................... G06M 3/00

(52) U.S. Cl. ................................. 377/26; 377/34; 377/109

(58) Field of Search .................................. 377/109, 26, 34

(56) References Cited

U.S. PATENT DOCUMENTS

| | | | |
|---|---|---|---|
| 4,947,410 | * | 8/1990 | Lippmann et al. .................... 377/26 |
| 6,084,935 | * | 7/2000 | Mather ................................... 377/33 |

* cited by examiner

Primary Examiner—Margaret R. Wambach
(74) Attorney, Agent, or Firm—Blakely, Sokoloff, Taylor & Zafman LLP

(57) ABSTRACT

A system and method of implementing a digit counter having a plurality of digits, ranging from a least significant digit (LSD) to a maximum positional digit (MDP), is described. In one embodiment, the system comprises switching a single digit for each increment from the LSD to the MPD. Further, after the MPD is switched, for the next increment, resetting the digits from the LSD to the MPD, and moving the LSD and the MPD by one digit, such that the original LSD becomes a higher precedence digit.

23 Claims, 8 Drawing Sheets

| Count | Optimized Digit Counter |
|---|---|
| 0 | 11111 11111 11111 11111 |
| 1 | 11111 11111 11111 11110 |
| 2 | 11111 11111 11111 11100 |
| 3 | 11111 11111 11111 11000 |
| 4 | 11111 11111 11111 10000 |
| 5 | 11111 11111 11111 00000 |
| 6 | 11111 11111 11110 00000 |
| 7 | 11111 11111 11100 00000 |
| 8 | 11111 11111 11000 00000 |
| 9 | 11111 11111 10000 00000 |
| 10 | 11111 11111 00000 00000 |
| 11 | 11111 11111 11111 11101 |
| 12 | 11111 11111 11111 11001 |
| 13 | 11111 11111 11111 10001 |
| 14 | 11111 11111 11111 00001 |
| 15 | 11111 11110 11110 00001 |
| 16 | 11111 11110 11100 00001 |
| 17 | 11111 11111 11000 00001 |
| 18 | 11111 11111 10000 00001 |
| 19 | 11111 11111 00000 00001 |
| 20 | 11111 11110 00000 00001 |
| 21 | 11111 11111 11111 11011 |
| 22 | 11111 11111 11111 10011 |
| 23 | 11111 11111 11111 00011 |
| 24 | 11111 11111 11101 00011 |
| 25 | 11111 11111 11100 00011 |
| 26 | 11111 11111 11000 00011 |
| 27 | 11111 11111 10000 00011 |
| 28 | 11111 11111 00000 00011 |
| 29 | 11111 11110 00000 00011 |
| 30 | 11111 11100 00000 00011 |
| 31 | 11111 11111 11111 10111 |
| 41 | 11111 11111 11111 01111 |
| 51 | 11111 11111 11110 11111 |
| 59 | 11111 10000 00000 11111 |
| 60 | 11111 00000 00000 11111 |
| 61 | 11111 11111 11101 11111 |
| 71 | 11111 11111 11011 11111 |
| 81 | 11111 11111 10111 11111 |
| 91 | 11111 11111 01111 11111 |
| 101 | 00000 11110 11111 11111 |
| 110 | 00000 00000 11111 11111 |

| Count | Binary Counter |
|---|---|
| 0 | 0 0 0 0 0 |
| 1 | 0 0 0 0 1 |
| 2 | 0 0 0 1 0 |
| 3 | 0 0 0 1 1 |
| 4 | 0 0 1 0 0 |
| 5 | 0 0 1 0 1 |
| 6 | 0 0 1 1 0 |
| 7 | 0 0 1 1 1 |
| 8 | 0 1 0 0 0 |
| 9 | 0 1 0 0 1 |
| 10 | 0 1 0 1 0 |
| 11 | 0 1 0 1 1 |
| 12 | 0 1 1 0 0 |
| 13 | 0 1 1 0 1 |
| 14 | 0 1 1 1 0 |
| 15 | 0 1 1 1 1 |
| 16 | 1 0 0 0 0 |
| 17 | 1 0 0 0 1 |
| 18 | 1 0 0 1 0 |
| 19 | 1 0 0 1 1 |
| 20 | 1 0 1 0 0 |
| 21 | 1 0 1 0 1 |
| 22 | 1 0 1 1 0 |
| 23 | 1 0 1 1 1 |
| 24 | 1 1 0 0 0 |
| 25 | 1 1 0 0 1 |
| 26 | 1 1 0 1 0 |
| 27 | 1 1 0 1 1 |
| 28 | 1 1 1 0 0 |
| 29 | 1 1 1 0 1 |
| 30 | 1 1 1 1 0 |
| 31 | 1 1 1 1 1 |

Fig. 2

| Count | Digit Counter | | | |
|---|---|---|---|---|
| 0 | 11111 | 11111 | 11111 | 11111 |
| 1 | 11111 | 11111 | 11111 | 11110 |
| 2 | 11111 | 11111 | 11111 | 11100 |
| 3 | 11111 | 11111 | 11111 | 11000 |
| 4 | 11111 | 11111 | 11111 | 10000 |
| 5 | 11111 | 11111 | 11111 | 00000 |
| 6 | 11111 | 11111 | 11110 | 00000 |
| 7 | 11111 | 11111 | 11100 | 00000 |
| 8 | 11111 | 11111 | 11000 | 00000 |
| 9 | 11111 | 11111 | 10000 | 00000 |
| 10 | 11111 | 11111 | 00000 | 00000 |
| 11 | 11111 | 11110 | 11111 | 11110 |
| 12 | 11111 | 11110 | 11111 | 11100 |
| 13 | 11111 | 11110 | 11111 | 11000 |
| 14 | 11111 | 11110 | 11111 | 10000 |
| 15 | 11111 | 11110 | 11111 | 00000 |
| 16 | 11111 | 11110 | 11110 | 00000 |
| 17 | 11111 | 11110 | 11100 | 00000 |
| 18 | 11111 | 11110 | 11000 | 00000 |
| 19 | 11111 | 11110 | 10000 | 00000 |
| 20 | 11111 | 11110 | 00000 | 00000 |
| 21 | 11111 | 11100 | 11111 | 11110 |
| 22 | 11111 | 11100 | 11111 | 11100 |
| 23 | 11111 | 11100 | 11111 | 11000 |
| 24 | 11111 | 11100 | 11111 | 10000 |
| 25 | 11111 | 11100 | 11111 | 00000 |
| 26 | 11111 | 11100 | 11110 | 00000 |
| 27 | 11111 | 11100 | 11100 | 00000 |
| 28 | 11111 | 11100 | 11000 | 00000 |
| 29 | 11111 | 11100 | 10000 | 00000 |
| 30 | 11111 | 11100 | 00000 | 00000 |
| 31 | 11111 | 11000 | 11111 | 11110 |
| 41 | 11111 | 10000 | 11111 | 11110 |
| 51 | 11111 | 00000 | 11111 | 11110 |
| 60 | 11111 | 00000 | 00000 | 00000 |
| 61 | 11110 | 11111 | 11111 | 11110 |
| 71 | 11100 | 11111 | 11111 | 11110 |
| 81 | 11000 | 11111 | 11111 | 11110 |
| 91 | 10000 | 11111 | 11111 | 11110 |
| 101 | 00000 | 11111 | 11111 | 11110 |
| 110 | 00000 | 00000 | 00000 | 00000 |

Fig. 3B

| Count | Optimized Digit Counter |
|---|---|
| 0 | 11111 11111 11111 11111 |
| 1 | 11111 11111 11111 11110 |
| 2 | 11111 11111 11111 11100 |
| 3 | 11111 11111 11111 11000 |
| 4 | 11111 11111 11111 10000 |
| 5 | 11111 11111 11111 00000 |
| 6 | 11111 11111 11110 00000 |
| 7 | 11111 11111 11100 00000 |
| 8 | 11111 11111 11000 00000 |
| 9 | 11111 11111 10000 00000 |
| 10 | 11111 11111 00000 00000 |
| 11 | 11111 11111 11111 11101 |
| 12 | 11111 11111 11111 11001 |
| 13 | 11111 11111 11111 10001 |
| 14 | 11111 11111 11111 00001 |
| 15 | 11111 11110 11110 00001 |
| 16 | 11111 11110 11100 00001 |
| 17 | 11111 11111 11000 00001 |
| 18 | 11111 11111 10000 00001 |
| 19 | 11111 11111 00000 00001 |
| 20 | 11111 11110 00000 00001 |
| 21 | 11111 11111 11111 11011 |
| 22 | 11111 11111 11111 10011 |
| 23 | 11111 11111 11111 00011 |
| 24 | 11111 11111 11101 00011 |
| 25 | 11111 11111 11100 00011 |
| 26 | 11111 11111 11000 00011 |
| 27 | 11111 11111 10000 00011 |
| 28 | 11111 11111 00000 00011 |
| 29 | 11111 11110 00000 00011 |
| 30 | 11111 11100 00000 00011 |
| 31 | 11111 11111 11111 10111 |
| 41 | 11111 11111 11111 01111 |
| 51 | 11111 11111 11110 11111 |
| 59 | 11111 10000 00000 11111 |
| 60 | 11111 00000 00000 11111 |
| 61 | 11111 11111 11101 11111 |
| 71 | 11111 11111 11011 11111 |
| 81 | 11111 11111 10111 11111 |
| 91 | 11111 11111 01111 11111 |
| 101 | 00000 11110 11111 11111 |
| 110 | 00000 00000 11111 11111 |

METHOD AND SYSTEM FOR IMPLEMENTING A DIGIT COUNTER OPTIMIZED FOR FLASH MEMORY

FIELD OF THE INVENTION

The present invention relates generally to electronic counters and more specifically to a monotonic digit counter optimized for flash implementation.

BACKGROUND OF THE INVENTION

Non-volatile counters are used in various electronic applications. One application utilizing non-volatile counters is the field of electronic commerce in which it is important to order financial transaction in a definite sequence. In such applications, it is important that the counting function be robust in order to withstand hardware and/or software failures. In sensitive applications, such as electronic commerce, it is also necessary for the counting function to be secure against unauthorized intrusion and security breaches. This need for secure counting functions against alteration of the count data is important in networked computer applications. It is desirable that a monotonic counter efficiently provide the count for a particular application and have a sufficiently high count rate. Thus, the counter should count high enough and fast enough for the application in which it is used. It is also desirable that counters retain count data in the absence of power, in the event of power failure.

One prior art method of implementing digital counter circuits is to use a battery or similar power supply in conjunction with a binary, digital counter circuit. However, such counters are disadvantageous in that they often are expensive and relatively unreliable. Battery packed circuits typically occupy a relatively large amount of circuit or device space and impose high count costs. Moreover, batteries are prone to failure and discharge, and must be constantly monitored and periodically replaced to prevent loss of the count data. Present binary counters also typically do not allow for user recovery of count data in the event of count interruption due to power loss, thus, reducing the reliability of such circuits.

SUMMARY OF THE INVENTION

A system and method of implementing a digit counter having a plurality of digits, ranging from a least significant digit (LSD) to a maximum positional digit (MPD), is described. In one embodiment, the system comprises switching a single digit for each increment from the LSD to the MPD. Further, after the MPD is switched, for the next increment, resetting the digits from the LSD to the MPD, and moving the LSD and the MPD by one digit, such that the original LSD becomes a higher precedence digit.

BRIEF DESCRIPTION OF THE DRAWINGS

The objects, features and advantages of the present invention will be apparent to one skilled in the art in light of the following detailed description in which:

FIG. 2 is a table illustrating the count values for a binary counter.

FIG. 3b is a table illustrating the count values for the digit counter of FIG. 3a.

FIG. 4 is a table illustrating the count values of one embodiment for a digit counter that is optimized for flash implementation.

FIGS. 5a through 5e are examples illustrating the counts for an optimized digit counter.

DETAILED DESCRIPTION

A monotonic digit counter optimized for flash implementation is described. In one embodiment, the counter is implemented in a flash memory array.

A counting scheme is considered which significantly increases the counting ability for flash memory as well as significantly reducing the average latency of counting. Such a scheme is important for constructing security building blocks required for applications including electronic commerce in which non-volatility and tamper-resistance is desirable. In one embodiment, the following criteria are met to implement a fully non-volatile monotonic counter: (1) meets the counting requirements assumed to be $10^{10}$ counts; (2) meets the reliability requirements assumed to be $10^5$ program erase cycles; (3) meets the performance requirements of an average throughput of 10 microseconds per transaction; and (4) meets the requirements to be robust to various catastrophic events and intentional attacks.

Figure 1:
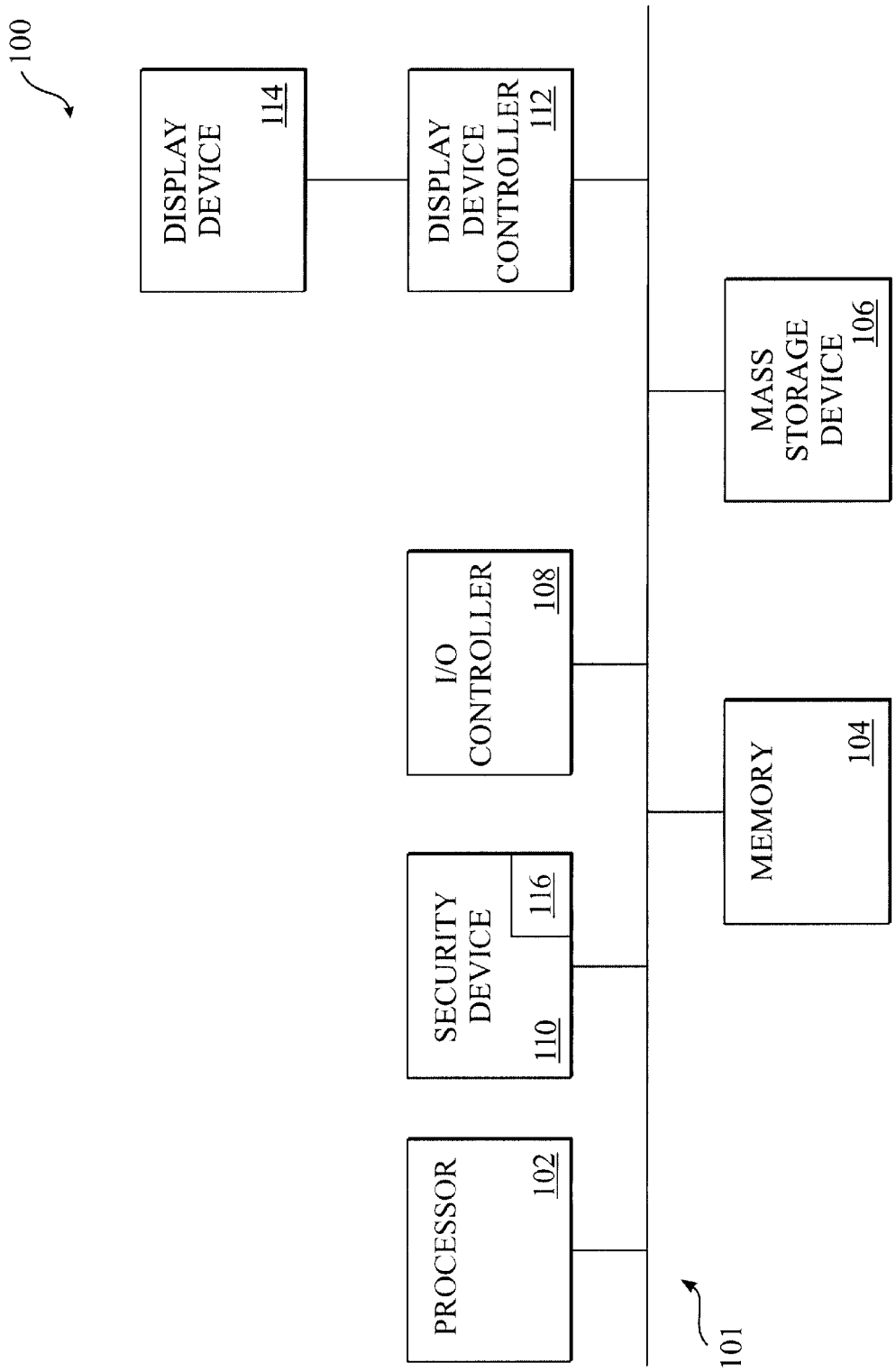
FIG. 1 is a block diagram of a computer system that includes an embodiment of the present invention.

FIG. 1 is a block diagram of one embodiment of a computer system 100 for implementing a digit counter. Computer system 100 includes processor 102 coupled via bus 101 to memory 104 and mass storage device 106. Memory 104 may be random access memory (RAM), read only memory (ROM), or other non-volatile memory, such as flash memory. Mass storage device 106 may be a large capacity storage device such as a hard disk drive, tape drive, or CD ROM drive. An input/output controller 108 is coupled to bus 101 for receiving commands or data entered through a keyboard, mouse, or similar input device. A display device controller 112 may be coupled to bus 101 for providing output through an appropriately coupled display device 114.

In one embodiment, computer system 100 may also include a security device 110. Security device 110 may be an embedded controller that includes digital circuits to execute security programs and perform mathematical transforms for security purposes. In one embodiment, security device 110 may also include monotonic counter 116. A monotonic counter is a counter that counts in one direction only (i.e., it either counts up or down). Monotonic counter 116 may be used to authenticate and uniquely identify the transactions that occur within the system. Monitoring the sequencing of transaction provides a level of security and protection of transactions from tampering by unauthorized parties and catastrophic events such as power loss.

It should be noted that the architecture of FIG. 1 illustrates an exemplary computer system and a computer system that implements embodiments of the present invention is not limited to the specific architecture shown. In addition, monotonic counter 116 may be implemented in any suitable electronic device and is not limited to implementation in a computer system.

In one embodiment, monotonic counter 116 may be implemented in a flash erasable programmable read only memory (EPROM) array. Flash memory devices typically use a one transistor memory cell to store bits of data. The bits of the flash memory array may be programmed, read, or erased by processor 102 or security device 116.

FIG. 2 is a table illustrating the count values for a binary counter. Many electronic devices use binary counters. The maximum count provided by a binary counter depends on the number of binary digits ("bits") used in the counter and is determined by the relationship $2^n$, where n is the number of bits in the counter. Thus, a binary counter features a relatively efficient count system in terms of the number of bits required to implement the count. Binary counters are also relatively easily implemented in digital memory cells that indicate a state depending on whether the cell is charged or not charged. For example, in a typical flash memory cell, a charged or programmed memory cell is read as a logic zero (0) and a discharged or erased cell is read as a logical one (1). In alternate embodiments, the reverse may be true.

When implemented in the EPROM array, the maximum count rate of a binary counter is limited by the program/erase cycle time of the memory cells within the EPROM array. The program cycle time is the time required to program a cell to a particular state, and the erase cycle time is the time required to erase one or more cells. As illustrated in FIG. 2, the incrementation in certain count values requires both the programming and erasure of certain bits in the binary counter. For example, in the count from 1 to 2, the least significant bit is programmed from "1" to "0" and the next least significant bit is erased from "0" to "1". If the program cycle time is equal to the erase cycle time, then the count from "0" to "1" (one erased bit) should take the same amount of time as to count from "1" to "2" (one erased bit and one programmed bit). Most memory cells, however, take much longer to erase than to program. For example, for a flash memory cell, the program cycle time may be in the order of ten microseconds whereas the erase cycle time may be in the order of one second. In this case, the count rate for the binary counter is limited to approximately one second per count increment. Such a slow rate is unacceptable for many present speed intensive applications.

Another consideration for a flash memory cell is the maximum number of program/erase cycles the memory cell can perform during the useful life of the cell. In a flash memory device, the continuous programming and erasing of the cell leads to stress and eventual breakdown of the outside layer comprising the memory cells due to the buildup of trapped charges in the cells and other reasons. For example, advance processing techniques have produced flash EPROM devices that feature a maximum number of program/erase cycles in the range of 100,000 cycles. Although such a high program/erase cycle figure produces cells that can withstand many program and erase operations, the program/erase cycle period represents a limit on the useful life of the flash cell. For applications in which the memory is used to store program code or data which is updated only periodically, the number of allowable program/erase cycles is not a particular critical factor. However, in applications, such as counters, in which cells are continuously programmed and erased, the maximum number of program/erase cycles is an important factor in determining the reliability of the device for the particular application.

Figure 3A:
FIG. 3a illustrates a base 10 digit counter.

FIG. 3a illustrates a base 10 digit counter 300. For a digit counter, a separate bit is used for each count increment. In the FIG. 3a illustration, the ten distinct digits of the base 10 number system are represented by the 10 distinct digit bits 301–310. The digit counter 300 is incremented from one to ten by programming each bit one at a time, beginning at the least significant digit (LSD) 301. For example, the digit counter 300 may be incremented to 1 by programming the $1^{st}$ bit 301 and further incremented to 2 by programming the $2^{nd}$ bit 302. When the digit counter 300 is incremented to 10, each of the distinct digit bits 301–310 is programmed. To increment the digit counter 300 to 11, the $11^{th}$ bit 311 is programmed and the distinct digit bits 302–310 are erased. The $11^{th}$ bit 311 is a higher precedence bit and represents the tens position holder of a positional number system. With the $11^{th}$ bit 311 programmed, the digit counter 300 may be incremented from 11 to 20 by again programming the appropriate distinct digit bits 301–310. To count past 20, an additional higher precedence bit would be required to indicate the twenties position holder.

FIG. 3b is a table illustrating the count values of digit counter 300 of FIG. 3a. In FIG. 3b, 15 bits are used to count from 0 to 110. The digit to the far right in FIG. 3b is the least significant digit (LSD) 301. The FIG. 3b embodiment requires a greater number of bits than the binary counter to count the same maximum count. Thus, to count to 110 using the binary counter uses 7 bits (1101110), and to count to 110 using the digit counter uses 20 bits. In binary counters each additional bit provides two times the original maximum count. However, in a binary counter, there is at least one erase cycle for every two counts. On the other hand, in the embodiment of FIG. 3b, the number of erase cycles is significantly reduced. In the embodiment shown in FIG. 3b, an erase cycle is used to change any number of digits from a zero to a one. Thus, one can count from zero to ten without any erase cycles. Counting to eleven uses a single erase cycle, to erase 9 bits. Thus, when implemented in a flash memory array, the FIG. 3b embodiment requires fewer over-all erase cycles than for the binary counter to count from 0 to 110. This also results in a shorter over-all erase time.

The digit counter of FIG. 3b illustrates a 10 order counter in which each of the ten digits of the counter requires ten bits each. The scheme as shown in FIG. 3b requires adding a higher precedence digit whenever a higher count is required. To count from 0 to 10, the FIG. 3b embodiment requires 10 digits and to count from 11 to 20, the FIG. 3b embodiment requires another higher precedence digit. Thus the scheme requires m digits of n bits each to count to $n^m$ counts.

FIG. 4 is a table illustrating the count values of one embodiment for an optimized digital counter. The scheme of FIG. 4 is similar to that of FIG. 3b for counts of from 0 to 10 (the ones count). Each bit is programmed, one-by-one, starting at a least significant bit (0) to a maximum positional bit (10). However, once the counter represented by FIG. 4 reaches a count of 11, the least significant bit 301 is not erased and the next significant bit from the right is used to begin counting from the next cycle of 1 to 10. That is, counting at 11 counts starting at the next lowest bit from the right for the tens count. To count to 20, the scheme of FIG. 4 requires one additional high precedence bit to be added as shown. The FIG. 4 embodiment moves to the left 1 digit and a new set of digits are used to count from 1 to 10 whenever a higher precedence digit is required. The digits for the ones count moves left one bit for every tens count cycle. The ones count digits thus moves at a count of 11, a count of 21, a count of 31, etc. as shown in FIG. 4. A higher precedence digit is required whenever a maximum positional digit count is obtained for the number base being used. For base 10, the maximum positional digit count is 10. To count from 0 to 20 in flash memory requires 11 bits and one erase cycle.

To count from 21 to 30, the ones count digits are moved to the left one bit and the count begins from the third bit from the right. The first and second bits on the right are the tens and twenties "higher precedence" bits. To continue the process to count to 100 would require 20 flash bits and 9 erase cycles. For m+n−1 flash bits allows m*n−1 counts with m erasures. For example, to count to 19, m=2 and n=10. In the FIG. 3b embodiment, each of the 10 least significant bits are programmed and erased for every 10 counts. In contrast, the FIG. 4 embodiment moves the bits to the left whenever a higher precedence bit is required for the count. Thus, the FIG. 4 embodiment requires three program/erase cycles for reach individual bit for a given count. In alternate embodiments, multiple levels of maximum positional digit counts with corresponding higher precedence digits may be used. Thus, for example, a maximum positional digit count may be defined in which the highest "higher precedence bit" is the $10^{th}$ bit, leaving 10 bits for actual counting. This permits a count to 110. A secondary maximum positional digit count may be implemented in another counter, or in higher level cells within the same counter. For example, in these embodiments, a secondary higher precedence digit is set for a secondary maximum positional digit count of higher precedence digits. Further, a tertiary higher precedence digit may be set for a tertiary maximum positional digit count of higher precedence digits, and so forth. Any number of levels may be used in these embodiments.

FIGS. 5a–5e are examples of the optimized digit counter of FIG. 4. FIG. 5a illustrates the bits set for a count of 0. In this embodiment, all bits are erased. FIG. 5b illustrates the bits set for a count of 10. In this embodiment, the first 10 bits beginning at bit 1 (401) and ending at bit 10 (410) are programmed or charged.

FIG. 5c illustrates the bits set for a count of 11. In this example, bit 1 (411) is erased and bit 2 (412) is programmed. The remaining bits are all erased. In this embodiment, the count from 11 through 20 begins by programming or charging the bits beginning at bit 2(412) rather than bit 1 (411).

FIG. 5d illustrates a count of 20. In this embodiment, the bits from bit 2 (416) through bit 11 (417) are programmed. Thus, in one embodiment, the ones count is indicated by programming the bits starting at bit 2 (416) rather than bit 1 (415). In addition, bit 1 (415) represents the higher precedence digit to count in the tens (11 through 20).

FIG. 5e illustrates the bits set for a count of 21. In this example, bit 1 (418) indicates the tens count (11 through 20) and bit 2 (419) indicates the twenties count (21 through 30). The count from 21 is represented by programming the ones bits beginning at bit 3 (420).

Figure 6:
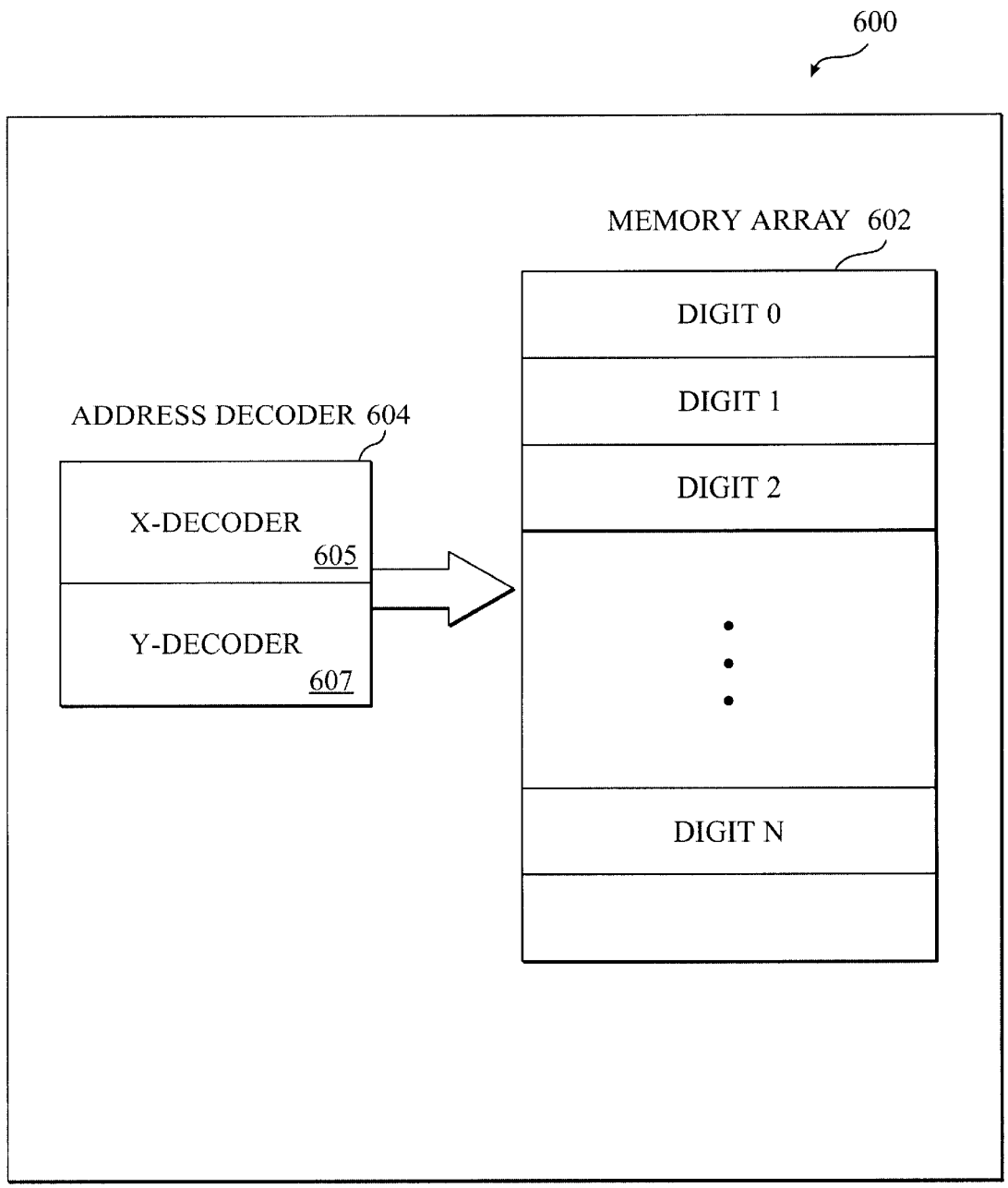
FIG. 6 is a block diagram illustrating a digit counter in a flash memory device.

FIG. 6 is a block diagram illustrating a digit counter in one embodiment of a flash memory device. Flash memory 600 is a block architecture/EEPROM that is divided into a number of blocks that allow a file system to program and erase individual blocks. Flash memory 600 includes a flash array 602 that includes flash memory cells arranged in blocks. An exemplary block consists of 512 columns by 1024 rows. An address decoder 604 includes an X-decoder 605 and a Y-decoder 607 that specify the row and column of addressable bits. The digits for the counter are sequentially stored in memory array 602. In one embodiment, all the digits of a counter, denoted digits 0 to N, are contained in a single block. In alternate embodiments, different digits may be contained in different blocks in memory array 602. In alternate embodiments, the digital counter may be implemented in other types of flash memory than the block based memory illustrated in FIG. 6.

In one embodiment, the digit based counting scheme may be used in a digital processing system that process security algorithms and provides a user interface to security functions provided by a security device, such as security device 110 in system 100 of FIG. 1. In alternate embodiments, flash memory 600 may be maintained and programmable within any electronic device and is not limited to a data processing system as shown in FIG. 1. In one embodiment, the system's interface to monotonic counter 116 may be implemented as an additional command through the device interface. The command may be configured to execute the increment operation followed by a return of the result. In one embodiment, the result may be returned through a binary result for each digit and having the system level software convert this to its corresponding binary value. In one embodiment, a processor connected to the monotonic counter, such as processor 102 of FIG. 1, may be programmed to automatically configure the counter based on application and device requirements provided by the system user. The processor may calculate the optimum number of digits and the base for each digit based on the input maximum count and minimum count rate requirements of the system.

Figure 7:
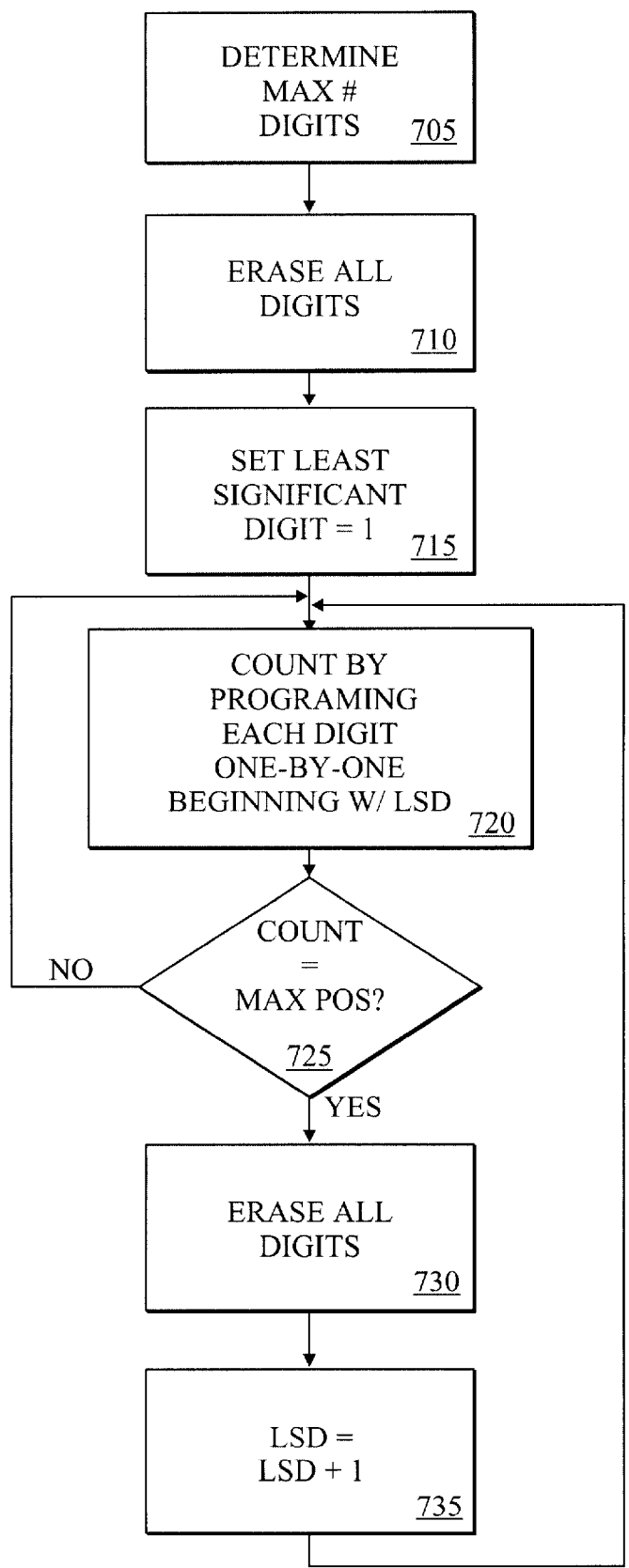
FIG. 7 is a flowchart illustrating the steps of one embodiment for a digit counter optimized for flash implementation.

FIG. 7 is a flow diagram of one embodiment for implementing an optimized digit counter. At processing block 705, the maximum number of digits for the counter is determined. In one embodiment, the counting requirement corresponds to the maximum count required per transaction. In addition, the performance requirement of the application may be determined. For example, the minimum count rate required by the application may be determined measured in terms of counts per second. Further, the cycle characteristics and limitations of the memory cells implementing the counter may be determined. In alternate embodiments, another suitable criteria may be used to determine the maximum number of digits.

At processing block 710, all digits within the counter are erased. In one embodiment, an erased digit is indicated by a "1" and a programmed digit is indicated by a "0". At processing block 715, a least significant digit (LSD) is initially set to 1. The LSD indicates the digit at which the count starts. For one embodiment, the LSD is and counting begins at the first or far-right digit. The LSD is the furthest digit to the right in the examples of FIG. 4 and FIGS. 5a–5e. Alternate locations of the LSD may be used.

At step 720, the counter begins the count. The counter increments the count by programming each digit one-by-one, beginning with the LSD. Thus, for a count increment of 1, the LSD is programmed from 1 to 0. For a count of 2, the next highest digit is programmed from 1 to 0. Thus, the count is incremented by each successive digit being programmed from 1 to 0. At processing block 725, a determination is made if the count is incremented to a maximum positional digit count. The maximum positional digit count is the maximum number of digits that may be programmed for a given numerical base (i.e., the base of the numerical system). For example, in the base 10 numerical system, the maximum positional digit count is 10 and the first 10 counts may be set by programming a specific digit from 1 to 0. At count 11, the maximum positional digit count for the base is reached and another digit is required to continue counting. If at processing block 725, the count is not greater than the maximum positional digital count, processing continues at processing block 720 until the maximum positional digit count is reached.

If at step 725 the count needs to be incremented past the maximum positional digit count, processing continues at step 730. At processing block 730, all the digits on the counter are erased. Next, at processing block 735, the location of the LSD is moved by 1. Thus, in incrementing the count from 10 to 11, all digits that have been programmed are erased at processing block 730 and the LSD is moved or changed from position 1 to position 2. Thus, a count of 11 would indicate a least significant digit plus 1 as being programmed and all other digits erased. Processing of blocks 720 through 735 continues until a maximum count is obtained, or the process is terminated.

The method of FIG. 7 reduces the number of erasures over a given count and decreases the number of erasures per digit. In the digit counter of FIG. 3, the first 10 digits are continuously turned from off to on and erased from on to off.

However, in the method of FIG. 7, any one of the digits is erased only 3 times over the entire count. In addition, the digit counter of FIG. 7 ensures that the counter is robust to intermittent power failures or security breaches that may cause the loss of count. The operation implemented in 730 only occurs after the next most significant digit is first incremented. Thus, any possible value of the digit being reset in 730 leads to a greater value than the prior value. Therefore, under either accidental or hostile situations, the counter maintains it monotonic behavior.

Several variations in the implementation for a monotonic digit counter optimized for flash implementation have been described.

The specific arrangements and methods herein are merely illustrative of the principles of this invention. Numerous modifications in form and detail may be made by those skilled in the art without departing from the true spirit and scope of the invention.

Although this invention has been shown in relation to a particular embodiment, it should not be considered so limited. Rather, it is limited only by the appended claims.

What is claimed is:

1. A method of implementing a digit counter comprising:
   providing a plurality of digits, ranging from an least significant digit (LSD) to a maximum positional digit (MPD);
   switching a single digit for each increment, from the LSD to the MPD; and
   after the MPD is switched, for the next increment, moving the LSD and the MPD by one digit, and resetting the digits from a newly defined LSD to the MPD, such that the original LSD becomes a higher precedence digit.

2. The method of claim 1 wherein switching, resetting, and moving are repeated until the count exceeds a maximum count.

3. The method of claim 2 further comprising:
   upon reaching the maximum count, for a next increment, resetting previously set higher precedence digits; and
   setting a secondary higher precedence digit.

4. The method of claim 3 wherein resetting and setting are repeated for multiple levels of maximum higher precedence digits.

5. The method of claim 1 wherein the digit counter is a monotonic counter.

6. The method of claim 1 wherein the digit counter is implemented in a flash memory array, the flash memory array comprising a plurality of memory cells.

7. The method of claim 6 wherein a number of program/erase cycles for each of the plurality of memory cells is reduced.

8. The method of claim 1 wherein the maximum positional digit count is determined by a number base of the count.

9. The method of claim 1 wherein the digit counter is contained in a security device configured to provide secure monotonic counting functions.

10. The method of claim 9 wherein said security device is contained in a data processing system.

11. The method of claim 1 further comprising:
    determining a maximum number of digits based upon a maximum count and a number base of the count.

12. A system comprising:
    a security device for providing secure monotonic counting functions; and
    a flash memory device for maintaining a count, the flash memory device comprising,
    a plurality of bits, the bits capable of being switched from an off position to an on position and from the on position to the off position, and
    a designated least significant bit (LSB) of the plurality of bits, wherein one of the plurality of bits is switched from the off to the on position for each increment of a count, beginning at the LSB, such that when a maximum digit count is reached, the location of the LSB is moved by one bit and the original designated LSB becomes a higher precedence digit, indicating that the maximum digit count had been reached.

13. A system for implementing a digit counter comprising:
    means for providing a plurality of digits, ranging from a least significant digit (LSD) to a maximum positional digit (MPD);
    means for switching a single digit for each increment, from the LSD to the MPD; and
    after the MPD is switched, for the next increment, means for resetting the digits from the LSD to the MPD, and means for moving the LSD and the MPD by one digit, such that the original LSD becomes a higher precedence digit.

14. A digit counter comprising:
    a plurality of bits, each of said plurality of bits capable of being switched from an off position to an on position and from the on position to the off position; and
    a least significant bit (LSB) of the plurality of bits, wherein each of the plurality of bits is switched from the off position to the on position one-by-one for each increment of a count, beginning at the LSB, such that when a maximum digit count is reached, the location of the LSB is moved by one bit and the original LSB becomes a higher precedence digit, indicating that the maximum digit count had been reached.

15. The digit counter of claim 14 further comprising a maximum positional digit count, wherein the LSB is moved by one bit when the count reached the maximum position digit count.

16. The digit counter of claim 15 wherein the maximum positional digit count is determined by a number base of the count.

17. The digit counter of claim 15 further comprising a maximum count value that can be reached by the digit counter, said maximum count value is determined by a maximum count and a number base of the count.

18. The digit counter of claim 14 wherein the digit counter is a monotonic counter.

19. The digit counter of claim 14 wherein the digit counter is implemented in a flash memory array, the flash memory array comprising a plurality of memory cells.

20. The digit counter of claim 19 wherein a number of program/erase cycles for each of the plurality of memory cells is reduced.

21. The digit counter of claim 14 wherein the digit counter is contained in a security device configured to provide secure monotonic counting functions.

22. The digit counter of claim 21 wherein the security device is contained in a data processing system.

23. A digit counter comprising:
    a plurality of bits, each of said plurality of bits capable of being switched from an off position to an on position and from the on position to the off position; and
    a least significant bit (LSB) of the plurality of bits, wherein each of the plurality of bits is switched from the off position to the on position one-by-one for each increment of a count, beginning at the LSB, such that when a maximum digit count is reached, a higher precedence digit is switched to the on position, indicating that the maximum digit count had been reached.

* * * * *